(12) United States Patent
Menyuk et al.

(10) Patent No.: US 7,940,818 B2
(45) Date of Patent: May 10, 2011

(54) PASSIVELY MODE LOCKED QUANTUM CASCADE LASERS

(75) Inventors: Curtis Robert Menyuk, Silver Spring, MD (US); Muhammad A. Talukder, Baltimore, MD (US)

(73) Assignee: The University of Maryland, Baltimore County, Baltimore, MD (US)

( * ) Notice: Subject to any disclaimer, the term of this patent is extended or adjusted under 35 U.S.C. 154(b) by 0 days.

(21) Appl. No.: 12/686,646

(22) Filed: Jan. 13, 2010

(65) Prior Publication Data

US 2010/0177798 A1    Jul. 15, 2010

Related U.S. Application Data

(60) Provisional application No. 61/144,178, filed on Jan. 13, 2009.

(51) Int. Cl.
*H01S 3/098* (2006.01)
*H01S 5/00* (2006.01)

(52) U.S. Cl. ............... 372/18; 372/45.013; 372/50.1
(58) Field of Classification Search ............... None
See application file for complete search history.

(56) References Cited

U.S. PATENT DOCUMENTS 5,513,204 A * 4/1996 Jayaraman ............... 372/75
6,563,852 B1 * 5/2003 Baillargeon et al. ......... 372/18

* cited by examiner

*Primary Examiner* — Minsun Harvey
*Assistant Examiner* — Sean Hagan
(74) *Attorney, Agent, or Firm* — Todd L. Juneau

(57) ABSTRACT

This invention relates to a self-induced transparency mode-locked quantum cascade laser having an active section comprising a plurality of quantum well layers deposited in alternating layers on a plurality of quantum barrier layers and form a sequence of alternating gain and absorbing periods, said alternating gain and absorbing periods interleaved along the growth axis of the active section.

11 Claims, 10 Drawing Sheets

PASSIVELY MODE LOCKED QUANTUM CASCADE LASERS

CROSS REFERENCE TO RELATED APPLICATIONS

The application claims priority benefit under 35 USC 119 (e) to U.S. provisional patent application Ser. No. 61/144,178 filed 13 Jan. 2009, the contents of which are incorporated by reference herein in their entirety.

STATEMENT REGARDING FEDERALLY SPONSORED RESEARCH OR DEVELOPMENT

Federal government funds were used in researching or developing this invention under National Science Foundation Grant No. EEC-0540832 under auspices of the MIRTHE Engineering Research Center.

NAMES OF PARTIES TO A JOINT RESEARCH AGREEMENT

None.

BACKGROUND

1. Field of the Invention

This invention relates to lasers that emit sub-picosecond pulses, and particularly to semiconductor lasers called quantum cascade lasers that emit in the mid- to far-infrared portion of the electromagnetic spectrum. These pulses have particular importance to applications where materials must be processed while minimizing heat transfer and damage to the materials, for example tissue removal in medicine and dentistry, and micromachining at the pico and femto scales. These pulses also have importance to applications involving spectroscopy, such as detection of trace compounds, clock synchronization in computer networks and telecommunication networks, and in light detection and ranging (lidar).

2. Background of the Invention

Although interband lasers can be high-power lasers, it is difficult to obtain any power at all in interband lasers in the mid-IR. Quantum cascade lasers are semiconductor lasers that emit in the mid- to far-infrared portion of the electromagnetic spectrum. Compared to other semiconductor diode lasers that emit in the mid-far IR, QC lasers have higher output power since laser emission is achieved from the transition of an electron through periodic thin layers of material forming a superlattice that introduces an electric potential over the device. Unlike other lasers, the lattice allows the electron to emit multiple photons as it traverses, or cascades, from one period of the lattice to the next. Semiconductor lattices in QC lasers can be made from layers of crystalline aluminum indium arsenide alternating with indium gallium arsenide, which create structures called quantum wells. One of the interesting features of QC lasers is that they operate at room temperature, without the need for cooling that might be found in non-QC lasers.

A technique for creating extremely short pulses of laser light is called mode-locking. By pumping a laser into a laser cavity consisting of two or more mirrors, the normal random oscillations of the light waves can be made synchronous and thus increase (constructive interference), called mode-locking, or may be made to interfere and damp (destructive interference). By using an electronic device that modulates the light intensity, an electrical signal can be used to establish a short pulse within the laser cavity in a technique called active mode-locking. However, in active mode-locking, pulses that are less than about one picosecond have not been obtained. An actively modelocked QCL that produces 3 ps pulses at 6.2 μm was reported by Wang et al.

In contrast, passive mode-locking does not require an external signal to maintain a continuous stream of pulses. Some examples of passive mode-locking use an intracavity absorber to absorb low-intensity light and preferentially amplify high-intensity spikes. Certain dyes in solution can act as saturable absorbers, but graphite-lattice structures, and the use of an aperture have also been used to focus and amplify the high-intensity light and attenuate the low-intensity light. Aperture transmission of high-intensity light and attenuation of low-intensity is called Kerr lens mode-locking, sometimes called "self mode-locking" However, no semiconductor laser has been passively mode-locked in the mid-IR range.

Laser light can have an interesting relationship to the medium or material that it impacts. McCall and Hahn observed a nonlinear optical propagation effect in resonant medium. According to their observation, a short pulse of coherent light above a critical input energy, for a given pulse width $\tau < T_2$, can pass through a saturable resonant medium as though the medium were transparent. However, below the critical energy this self-induced transparency (SIT) phenomenon cannot happen, rather, the pulse energy is absorbed.

Because QCLs typically have relatively short values of $T_1$ (1-10 ps) and relatively long values of $T_2$ (~100 fs) compared to other semiconductor lasers, standard passive modelocking cannot be achieved. However, the conditions are ideal for any approach, denoted SIT modelocking. After the original observation of passive modelocking, it was speculated that passive modelocking was SIT modelocking, but this speculation was later proved to be incorrect. Still later, Kozlov studied the possibility of obtaining SIT modelocking by using gas lasers with two separate tubes in which the gases in the two different tubes have the same resonance lines and the gas in one tube has twice the dipole moment of the other. However, this design cannot be implemented in practice. Applications for mode-locked QC lasers include three-dimensional micro-, or nano-fabrication or machining, investigative and diagnostic spectroscopy, optical communication and electronic devices such as limiters or storage, and medical and dental probes and surgical devices.

BRIEF SUMMARY OF THE INVENTION

To address limitations in the prior art, there is provided in one preferred embodiment a self-induced transparency mode-locked quantum cascade laser, comprising:
(i) an active section comprising a plurality of quantum well layers deposited in alternating layers on a plurality of quantum barrier layers and form a sequence of alternating gain and absorbing periods, said alternating gain and absorbing periods interleaved along the growth axis of the active section, wherein the absorbing periods have a dipole moment of about twice that of the gain periods;
(ii) an optical cavity that houses the active section and permits amplified light to escape;
(iii) an externally supplied seed pulse; and
(iv) current injectors structured and arranged to apply an electric control field to the active section.

In another preferred embodiment, there is also provided wherein the quantum barrier layers are made using Indium-Aluminum-Arsenide, and the quantum well layers are made using Indium-Gallium-Arsenide.

In another preferred embodiment, there is also provided wherein the gain and absorbing periods are designed to provide a mid-IR wavelength laser.

In another preferred embodiment, there is also provided wherein the gain and absorbing periods are designed to provide a mid-IR wavelength laser having a wavelength of between about 3 micrometers and about 12 micrometers, and in some embodiments between about 8 and about 12 micrometers.

In another preferred embodiment, there is also provided wherein the gain and absorbing periods are designed to provide coherence times ≪ gain recovery times ≪ round trip times.

In another preferred embodiment, there is also provided wherein the gain and absorbing periods are designed to provide: coherence times of at least 50 to about 200 femtoseconds, and in one embodiment about 100 femtoseconds; gain recovery times of at least 1 to about 10 picoseconds, and in one embodiment about 1 picosecond; and round trip times of at least 40-60 picoseconds, in one embodiment 50 picoseconds.

In another preferred embodiment, there is also provided wherein the gain and absorbing periods are designed to provide a heterostructure having a ratio of 4 gain periods:1 absorbing period. In other embodiments, the heterostructure may include a ratio of 3 gain periods to 1 absorbing period, or 5 gain periods to 1 absorbing period.

In another preferred embodiment, there is also provided wherein the input pulse is a π pulse in the gain medium.

In another preferred embodiment, there is also provided wherein each gain period and each absorbing period have over 16 quantum layers.

In another preferred embodiment, there is also provided wherein the gain and absorbing periods are designed to suppress continuous waves and eliminate spatial hole burning.

In another preferred embodiment, there is also provided wherein the gain and absorbing periods are designed to provide a mid-IR wavelength laser having pulse length less than 100 femtoseconds long.

Figure 1:
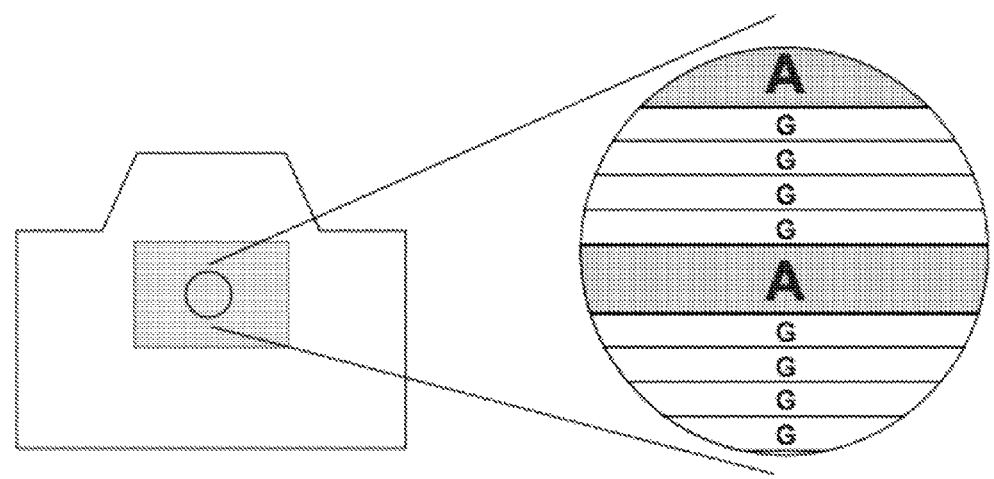
FIG. 1 is a Schematic of a QCL structure with gain and absorbing periods. On the left, we show a cutaway view of the QCL structure. The active region is shown as a filled-in rectangle. We are looking in the direction along which light would propagate. Electrodes would be affixed to the top and bottom so that electrons flow vertically. The heterostructure would also be stacked vertically as shown on the right. We show one absorbing period for every four gain periods, corresponding schematically to the case in which the electron density in the gain medium $N_g \cong 4\times$ the electron density in the absorbing medium ($N_a$), and we show absorbing periods that are twice as large as gain periods to indicate schematically that the dipole moment in the absorbing medium ($\mu_a$)$\cong 2\times$ the dipole moment in the gain medium ($\mu_g$).

Stability limits of the normalized absorption vs the normalized gain coefficients with different $T_1/T_2$. In equilibrium, the gain medium is completely inverted, i.e., $\Delta_{g0}=1.0$ and the absorbing medium is completely uninverted, i.e., $\Delta_{a0}=-1.0$. In each bundle of dashed lines, corresponding to a fixed value of $\bar{\tau}$, $T_1/T_2$ decreases from left to right.

FIG. 7

Pulse evolution in the system. (a) Gain and absorption coefficients are in the stable regime, $\bar{g}=4.0$, $\bar{a}=3.5$. (b) Gain and absorption coefficients are in the regime in which continuous waves are unstable, $\bar{g}=4.0$, $\bar{a}=1.0$. (c) Gain and absorption coefficients are in the regime where any initial pulse attenuates, $\bar{g}=4.0$, $\bar{a}=7.8$. The ratio $T_1/T_2$ equals 10 in all cases. In equilibrium, the gain medium is completely inverted, i.e., $\Delta_{g0}=1.0$, and the absorbing medium is completely uninverted, i.e., $\Delta_{a0}=-1.0$.

FIG. 8

Stability limits of the normalized absorption ($\bar{a}$) vs the normalized gain ($\bar{g}$) coefficients with different values of $T_{1a}/T_{1g}$. We set $T_{2g}=T_{2a}$ and $T_{1g}/T_{2g}=10$ in all cases. In equilibrium, the gain medium is completely inverted, i.e., $\Delta_{g0}=1.0$, and the absorbing medium is completely uninverted, i.e., $\Delta_{a0}=-1.0$

FIG. 9

Stability limits of the ratio of the dipole moments in the absorbing and gain media ($\bar{\mu}$) vs the normalized gain coefficient ($\bar{g}$) for three cases of normalized absorption ($\bar{a}$). The ratio $T_1/T_2$ is 10 in all cases. In equilibrium, the gain medium is completely inverted, i.e., $\Delta_{g0}=1.0$, and the absorbing medium is completely uninverted, i.e., $\Delta_{a0}=-1.0$

FIG. 10

Input pulse energy limits vs normalized input pulse duration ($\tau_i/T_2$) for two different cases of $\bar{g}$ and $\bar{a}$. In both the cases, we set $T_1/T_2=10$. In equilibrium, the gain medium is completely inverted, i.e., $\Delta_{g0}=1.0$, and the absorbing medium is completely uninverted, i.e., $\Delta_{a0}=-1.0$.

DETAILED DESCRIPTION OF THE INVENTION

Quantum cascade lasers (QCLs) are important light sources in the midinfrared range, about 3 μm to about 12 μm. The light is generated by a transition between two subbands in the conduction band, in contrast to interband semiconductor lasers. As a consequence, the subbands have narrow linewidths and long coherence times $T_2$ compared to interband semiconductor lasers. Values of $T_2$ on the order of 100 fs are achievable. Another important feature of the QCLs is their rapid gain recovery times $T_1$ compared to interband semiconductor lasers due to fast LO-phonon relaxation. Typical values of $T_1$ are in the range 1-10 ps, which is short compared to $T_{rt}$, the round-trip time in the cavity. Typical values of $T_{rt}$ are on the order of 50 ps. The narrow linewidths and fast recovery times of QCLs make it difficult to achieve conventional passive mode locking. Gain bandwidths that are significantly larger than the pulse bandwidths are required, and that is hard to obtain when the linewidths are narrow, as in QCLs. A saturable gain, with a recovery time that is long compared to $T_{rt}$, is also required for conventional passive mode locking in order to suppress continuous waves, and the typical gain recovery times in QCLs are shorter than the round-trip times. Thus, conventional passive mode locking cannot work in QCLs that operate in a standard parameter regime. However, QCLs are an ideal tool for creating the long-predicted, never-observed SIT mode locking. The relationship $T_2 \ll T_1 \ll T_{rt}$, which is typical for QCLs, is precisely what is needed for SIT mode locking, and the ease of band-gap engineering in QCLs makes it possible to interleave gain and absorbing periods as needed. Conversely, SIT mode locking of QCLs makes it possible to obtain mode-locked pulses from a mid-infrared laser that are less than 100 fs in duration. Using SIT mode-locking in a QC laser also addresses the stability problems relating to the growth of continuous waves and spatial hole burning. In SIT, continuous waves are suppressed and mode-locked pulses propagate in one direction or the other at a time so that spatial hole burning is not an issue.

Referring now to the FIGURES, specific non-limiting examples and preferred embodiments of SIT mode-locking structures for QC lasers are described.

In order to obtain SIT mode locking, it is necessary to have two highly coherent resonant media with nearly equal resonant frequencies. In one medium, denoted the gain medium, electrons should be injected into the upper lasing state so that the resonant states are nearly inverted. In the other medium, denoted the absorbing medium, electrons should be injected into the lower state so that the resonant states are not inverted. Also, the dipole strength in the absorbing medium should be nearly equal to twice the dipole strength in the gain medium. At the same time, the ratio of the gain per unit length to the absorption per unit length should be small enough so that the growth of continuous waves is suppressed, but large enough so that a mode-locked pulse can stably exist. It is possible to simultaneously satisfy all these conditions by interleaving gain and absorbing periods that have the required dipole strengths as shown schematically in FIG. 1.

FIG. 1 shows a schematic of a QCL structure with gain and absorbing periods. On the left, we show a cutaway view of the QCL structure. The active region is shown as a filled-in rectangle. We are looking in the direction along which light would propagate. Electrodes would be affixed to the top and bottom so that electrons flow vertically. The heterostructure would also be stacked vertically as shown on the right. We show one absorbing period for every four gain periods, corresponding schematically to the case in which the electron density in the gain medium ($N_g$)≅4× the electron density in the absorbing medium ($N_a$), and we show absorbing periods that are twice as large as gain periods to indicate schematically that the dipole moment in the absorbing medium ($\mu_a$) ≅2× the dipole moment in the gain medium ($\mu_g$). By appropriately choosing the number of gain periods and the number of absorbing periods, one can obtain any desired ratio for the gain and absorption per unit length. As long as there are many periods within the transverse wavelength of the lasing mode, the gain and absorbing periods will experience the same light intensity.

Figure 2:
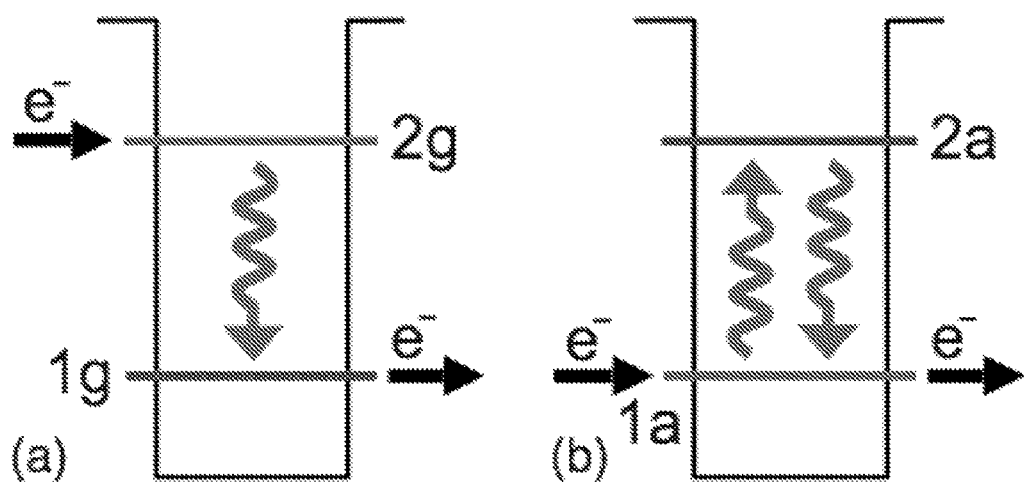
FIG. 2. Schematic of the (a) gain and (b) absorbing media. Black straight-line arrows indicate the direction of electron flow. Red wavy arrows indicate radiative transitions.

In FIG. 2, we show simplified two-level resonant structures for the gain and absorbing media. FIG. 2 shows a schematic of the (a) gain and (b) absorbing media. Black straight-line arrows indicate the direction of electron flow. Red wavy arrows indicate radiative transitions. In the gain medium, electrons are injected into level $2g$ and are extracted from level $1g$. The carrier lifetime in $2g$ should be longer than the mode-locked pulse duration and the equilibrium population inversion should be nearly complete. When an optical pulse with a photon energy equal to the resonant energy impinges on the gain medium with its polarization oriented in the direction perpendicular to the layers, electrons scatter to level $1g$ and photons are emitted. Then, the electrons are nonradiatively extracted from level $1g$. In the absorbing medium, electrons are injected into the lower level $1a$. The lifetime of state $1a$ should again be longer than the pulse width. When a light pulse of the appropriate wavelength and polarization impinges on the absorbing medium, photons are absorbed and electrons jump to level $2a$. If a light pulse has enough intensity, then photons are re-emitted with no overall loss in one Rabi oscillation time. In order for these processes in the gain medium and absorbing medium to occur simultaneously, the energy spacing between the resonant levels should be nearly the same in both media.

In the theory of resonant two-level media, both $\pi$ pulses and $2\pi$ pulses play an important role. A $\pi$ pulse is a pulse with sufficient energy to exactly invert the lower state population of a two-level medium if the medium is initially uninverted, or, conversely, to uninvert the upper state if the medium is initially inverted. In the former case, the pulse experiences loss and rapidly attenuates, but, in the latter case, the pulse experiences gain. The pulse duration is approximately half a Rabi oscillation period. If a pulse lasts a longer time than required to drive the population from the upper level to the lower, then the medium will amplify the first part of the pulse and attenuate the latter part, in a way that shortens the pulse. Conversely, if a pulse is initially too short, it is lengthened. Because a $\pi$ pulse experiences gain, it is natural that shortly after the initial observations of passive mode locking in lasers, it was proposed that the pulses in these lasers are actually SIT-induced $\pi$ pulses. However, these pulses are not suitable for use on their own as passively mode-locked laser pulses. Where one $\pi$ pulse can exist, there is nothing to prevent continuous waves from generating multiple pulses leading to chaos rather than a single stable pulse oscillating in a laser cavity.

One can circumvent this difficulty by combining a gain medium in which the optical pulse is a $\pi$ pulse with an absorbing medium in which the optical pulse is a $2\pi$ pulse. A $2\pi$ pulse is a pulse with sufficient energy so that in an uninverted medium the lower state population is first inverted and then returned to the lower state in approximately one Rabi oscillation. A $2\pi$ pulse like a $\pi$ pulse is stable. If its initial duration is too long, the duration decreases, and, if its initial duration is too short, the duration increases. The $2\pi$ pulse propagates through the medium without loss, in contrast to continuous waves at the resonant optical frequency, which experience loss. This remarkable property is what led to the name "self-induced transparency." Because of this property, the absorbing medium acts like the saturable loss in a conventional passively modelocked system, suppressing the growth of continuous waves, while allowing a short pulse to propagate.

It is evidently important that both the gain medium and the absorbing medium act on the optical pulse simultaneously. We may achieve this simultaneous interaction by designing a QCL structure that has the gain and absorbing periods interleaved along the growth axis of the structure, as shown in FIG. 1. By making the dipole moment in the absorbing periods twice that of the gain periods, a $\pi$ pulse in the gain periods is a $2\pi$ pulse in the absorbing periods. Therefore, an injected $\pi$ pulse completely depletes the gain medium as it makes its way through the QCL, whereas, the absorbing medium becomes transparent. We will show that by controlling the amount of gain and absorption per unit length in the gain and absorbing media, pulse durations can be controlled.

In order to suppress spatial hole burning, the RNGH instability, or the growth of multiple pulses, we do not want continuous waves to grow in an SIT mode-locked laser. The absorption parameter should be large enough to keep the laser operating below the threshold for the growth of continuous waves. Therefore, the laser cannot self-start and it is necessary to use some means to start the mode locking. Essentially, we need to create an optical pulse that has sufficient energy and a duration on the order of $T_1$. This pulse can be created by using an electrical shock, electrical pulse, a mechanical vibration or an external optical seed. We suggest two optical approaches. First, we can seed the pulse from an external source by injection locking, or, second, we can use active mode locking to generate an initial pulse that will have a suitable energy and initial duration for SIT mode locking. It may also be possible to use a mechanical or an electrical impulse to start the mode locking.

Quantum Cascade Laser Structures

We have designed QCL gain and absorbing periods that fulfill the SIT mode locking requirements at two different wavelengths, 8 and 12 μm. Similar structures can be designed over a broad range of mid-IR wavelengths, from about 3 μm to about 12 μm. We use the $In_{0.52}Al_{0.48}As/In_{0.53}Ga_{0.47}As$ material system for the active region in our design since most of the demonstrated QCLs to date have been based on this material system. However, mode-locking structures operating at less than 8 μm will be difficult to design using this material system. Since electrons are injected into the lower state in the absorbing medium, the upper state approaches close enough to the conduction-band edge at wavelengths below 8 μm to lead to a large increase in the carrier loss due to scattering to the continuum-like states. To design a mode-locking structure at shorter wavelengths, it should be possible to use a strain-balanced InAlAs/InGaAs material system.

The gain periods in our design are typical QCL periods. We design a three-quantum-well active region for the gain periods that has a diagonal transition, which lowers the dipole moment relative to designs that have a vertical transition. This choice simplifies the design of the absorbing periods. Population inversion is achieved by confining the resonant states in separate quantum wells and depopulating the lower state through phonon relaxation to another state sitting below the lower resonant state. While the dipole moment in the gain periods is not high, the upper state lifetime is larger than in the case of vertical transitions so that the gain remains high. The design of absorbing periods is different from the design of gain periods. The combined requirements of carrier injection into and extraction from the lower resonant level and a dipole moment twice that of the gain periods make it difficult to design the absorbing periods. To achieve a large dipole moment, the transition should be between two excited states. The carrier lifetime is made high by reducing scattering through phonon relaxation and reducing the carrier tunneling from the lower resonant state into the succeeding injector states. The injector regions have different designs when the electrons are tunneling into a gain or absorbing active region due to the different quantum electronic structures of gain and absorbing active regions.

Figure 3:
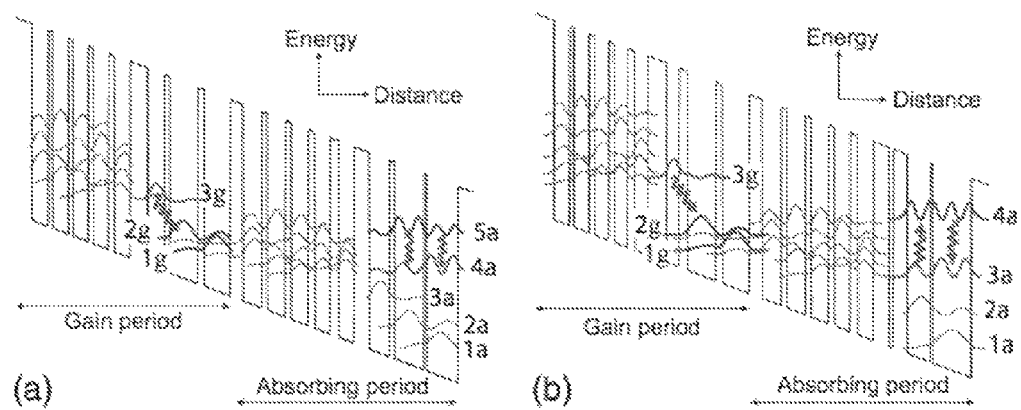
FIG. 3. Conduction-band diagram and moduli-squared wave functions for one gain and one absorbing period of the (a) 12 μm, (b) 8 μm mode-locking QCL structures. The sequence of layer dimensions is (in Å, starting from left): (a) 37, 36, 10, 35, 10, 34, 11, 34, 12, 35, 39, 37, 12, 62, 14, 58, 28, 42, 12, 40, 13, 37, 15, 34, 15, 34, 45, 11, 65, 6, 69; (b) 42, 34, 9, 33, 12, 30, 13, 28, 16, 28, 41, 27, 18, 62, 14, 58, 28, 42, 12, 40, 13, 37, 13, 34, 16, 34, 34, 9, 31, 50, 5, 84. The numbers in bold type indicate $In_{0.52}Al_{0.48}As$ barrier layers and those in roman type indicate $In_{0.53}Ga_{0.47}As$ well layers. Red wavy arrows indicate radiative transitions.

The structure in FIG. 3(a) emits light at 12 μm. FIG. 3. Conduction-band diagram and moduli-squared wave functions for one gain and one absorbing period of the (a) 12 μm, (b) 8 μm mode-locking QCL structures. The sequence of layer dimensions is (in Å, starting from left): (a) 37, 36, 10, 35, 10, 34, 11, 34, 12, 35, 39, 37, 12, 62, 14, 58, 28, 42, 12, 40, 13, 37, 15, 34, 15, 34, 34, 45, 11, 65, 6, 69; (b) 42, 34, 9, 33, 12, 30, 13, 28, 16, 28, 41, 27, 18, 62, 14, 58, 28, 42, 12, 40, 13, 37, 13, 34, 16, 34, 34, 9, 31, 50, 5, 84. The numbers in bold type indicate $In_{0.52}Al_{0.48}As$ barrier layers and those in roman type indicate $In_{0.53}Ga_{0.47}As$ well layers. Red wavy arrows indicate radiative transitions.

Electrons are injected into level 3g, and the gain transition is between levels 3g and 2g. The dipole moment between the resonant levels is given by $\mu_g/e=1.81$ nm. Level 3g has a lifetime of ~2 ps. Level 1g is positioned approximately at phonon resonance with 2g. Level 2g has a lifetime of ~0.5 ps, so that the population inversion is high. The transition energy is 101 meV. In the absorbing periods, electrons are injected into level 4a and they jump to level 5a by absorbing photons. The lifetime of level 5a is ~0.83 ps. The absorbing levels are separated by 101 meV and have a dipole moment $\mu_a/e=3.65$ nm. After electrons are injected into level 3g, they have a long lifetime of 2 ps due to the low scattering rate. When the optical pulse arrives, the population in level 3g decreases to level 2g. Level 2g is depopulated quickly to level 1g through phonon interactions and the electrons then transit to the following injector stage. Population inversion is restored before the optical pulse makes a round trip in the laser cavity. Electrons sit in level 4a after being injected by the preceding injector stage. When an optical pulse reaches the absorbing periods, electrons from level 4a move to level 5a by absorbing photons. Since the pulse is a 2π pulse for the absorbing medium, level 5a is depleted by making a Rabi oscillation, during which photons are emitted.

In the structure given in FIG. 3(b), the gain transition is between levels 3g and 2g. The dipole moment between the gain levels is 1.55 nm and the lifetime of level 3g is ~3 ps. The resonant transition energy is 150 meV in both the gain and absorbing periods. In this structure, electrons are injected into level 3a in the absorbing periods and the absorbing transition is between levels 3a and 4a. Level 4a has a lifetime of ~0.8 ps. The absorbing levels have a dipole moment $\mu_a/e=2.95$ nm.

In a QCL, the time $T_1$ is determined mainly by the LO-phonon relaxation rate. The LO-phonon relaxation rate depends mainly on the energy spacing between the levels and the overlap of the corresponding wave functions, so that $T_1$ depends on the details of the band structure and can vary greatly from design to design. Indeed, strictly speaking there is not a single $T_1$ in either the gain or the absorbing medium since there are more than two levels involved in the dynamics in both media. In the gain stage of the QCL structure given in FIG. 3, the upper state is confined in a separate quantum well from the other states in the active region, so that the phonon relaxation rate is smaller than when all the active states are in the same well and the lifetime is higher. However, the absorbing stage is designed such that the upper and lower state wave functions have a large overlap, which makes the dipole moment higher, but decreases the lifetime. Therefore, in practical designs, we find $T_{1g} > T_{1a}$.

Generally, if the gain and absorbing media are grown from the same material system, it is reasonable to assume $T_{2g} \approx T_{2a}$. In the QCL structure that we propose, an $In_{0.52}Al_{0.48}As/In_{0.53}Ga_{0.47}As$ material system is used for both the gain and absorbing periods, so that $T_{2a}$ should not vary much from $T_{2g}$. However, there has yet to be a detailed theoretical calculation of these coherence times. In a QCL, the value of $T_2$ depends mainly on electron-electron scattering, electron-LO phonon scattering, and interface scattering. Therefore, the values of $T_{2g}$ and $T_{2a}$ may differ somewhat, depending on the details of the design.

Maxwell-Bloch Equations

Wang et al. and Gordon et al. have observed the RNGH instability in QCLs with only gain periods. They showed evidence for Rabi oscillations and demonstrated that the two-level Maxwell-Bloch equations apply to QCLs in some parameter regimes, although they also showed that saturable absorption affects the behavior quantitatively, significantly reducing the RNGH threshold. Gordon et al. attributed the saturable absorption to Kerr lensing that increases the mode overlap with the active region and reduces the wall losses. These effects depend sensitively on the details of the QCL geometry. They also observed that spatial hole burning due to the interaction of forward- and backward-propagating waves has an important effect on the pulse spectrum. They did not find it necessary to include chromatic dispersion or other nonlinearities. Motivated by these results, we use a simple two-level model based on the standard one-dimensional Maxwell-Bloch equations. The Maxwell-Bloch equations that describe the light propagation and light-matter interaction in QCL having interleaved gain and absorbing periods may be written as $$\frac{n}{c}\frac{\partial E}{\partial t} = -\frac{\partial E}{\partial z} - i\frac{kN_g\Gamma_g\mu_g}{2\varepsilon_0 n^2}\eta_g - i\frac{kN_a\Gamma_a\mu_a}{2\varepsilon_0 n^2}\eta_a - \frac{1}{2}lE, \quad (1a)$$

$$\frac{\partial \eta_g}{\partial t} = \frac{i\mu_g}{2\hbar}\Delta_g E - \frac{\eta_g}{T_{2g}} \quad (1b)$$

$$\frac{\partial \Delta_g}{\partial t} = \frac{i\mu_g}{\hbar}\eta_g E^* - \frac{i\mu_g}{\hbar}\eta_g^* E + \frac{\Delta_{g0}-\Delta_g}{T_{1g}} \quad (1c)$$

$$\frac{\partial \eta_a}{\partial t} = \frac{i\mu_a}{2\hbar}\Delta_a E - \frac{\eta_a}{T_{2a}} \quad (1d)$$

$$\frac{\partial \Delta_a}{\partial t} = \frac{i\mu_a}{\hbar}\eta_a E^* - \frac{i\mu_a}{\hbar}\eta_a^* E + \frac{\Delta_{a0}-\Delta_a}{T_{1a}} \quad (1e)$$

where the subscripts g and a in Eq. (1) represent gain and absorption, respectively. The independent variables z and t are length along the light-propagation axis of the QCL and time. The dependent variables $E, \eta_{g,a}$, and $\Delta_{g,a}$ refer to the envelopes of the electric field, gain polarization, and gain inversion. The parameters $\Delta_{g0}$ and $\Delta_{a0}$ refer to the equilibrium inversion away from the mode-locked pulse. The parameters n and c denote the index of refraction and the speed of light. The parameters $N_{g,a}\Gamma_{g,a}$, denote the effective electron density multiplied by the overlap factor. The parameters k, l, $\varepsilon_0$, and $\hbar$ denote the wave number in the active region, the linear loss including the mirror loss, the vacuum dielectric permittivity, and Planck's constant. The notation closely follows that of Wang et al., with the differences that we have an absorbing as well as a gain medium, and we are considering unidirectional propagation, as is appropriate for a mode-locked pulse.

In order to achieve SIT mode locking, the growth of continuous waves must be suppressed. At this point, two observations are made. First, because continuous waves are suppressed, forward- and backward-propagating waves cannot interact, and spatial hole burning will not occur. Second, we did not include saturable absorption in Eq. (1) because we are not certain how to do so. This contribution was added phenomenologically to the Maxwell-Bloch equations by Wang et al. and Gordon et al., based on experimental observations in particular QCLs and was attributed to effects that depend sensitively on the geometry of those QCLs.

In order to suppress continuous waves, the gain must be below threshold. To derive this condition, we set $\Delta_g=\Delta_{g0}$ and $\Delta_a=\Delta_{a0}$ in steady state, where there is no evolution in z. We then find from Eqs. (1b) and (1d), $$\eta_g = i\frac{\mu_g}{2\hbar}T_{2g}\Delta_{g0}E, \quad (2)$$

$$\eta_a = i\frac{\mu_a}{2\hbar}T_{2a}\Delta_{a0}E,$$

where we are considering continuous waves, so that there is no dependence on t and the t-derivatives vanish. After substitution in Eq. 1a, we obtain in steady state $$\frac{kN_g\Gamma_g\mu_g^2 T_{2g}\Delta_{g0}}{2\varepsilon_0 n^2\hbar} + \frac{kN_a\Gamma_a\mu_a^2 T_{2a}\Delta_{a0}}{2\varepsilon_0 n^2\hbar} - l = 0, \quad (3)$$

which may also be written as $g\Delta_{g0}+a\Delta_{a0}-1=0$, where $$g = \frac{kN_g\Gamma_g\mu_g^2 T_{2g}}{2\varepsilon_0 n^2\hbar}, \quad a = \frac{kN_a\Gamma_a\mu_a^2 T_{2a}}{2\varepsilon_0 n^2\hbar}. \quad (4)$$

Physically, the parameter g corresponds to the gain per unit length from the gain periods of the QCL and the parameter a corresponds to the absorption per unit length from the absorbing periods. The condition for the linear gain to remain below threshold is $g\Delta_{g0}+a\Delta_{a0}-1<0$. In the case of a fully inverted gain medium, so that $\Delta_g=\Delta_{g0}=1$ and a fully uninverted absorbing medium so that $\Delta_a=\Delta_{a0}=-1$, the condition to suppress continuous waves becomes $g-a-1<0$.

Assuming that $T_{1g}$ and $T_{1a}$ are large enough so that they may be set equal to $\infty$ in Eq. 1, and focusing on the special case in which $\mu_a=2\mu_g$ and the pulse is a $\pi$ pulse in the gain medium, Eq. 1 has an exact analytical solution that we may write as $$E = \frac{\hbar}{\mu_g \tau}\text{sech}x, \quad (5a)$$

$$\eta_g = \frac{iB_g}{2}\Delta_{g0}\text{sech}x, \quad (5b)$$

$$\Delta_g = B_g\Delta_{g0}\left(\frac{\tau}{T_{2g}}-\tanh x\right), \quad (5c)$$

$$\eta_a = \frac{iB_a}{2}\Delta_{a0}\left(-\text{sech}x\tanh x + \frac{\tau}{3T_{2a}}\text{sech}x\right), \quad (5d)$$

$$\Delta_a = \frac{B_a}{2}\Delta_{a0}\left(1+\frac{\tau^2}{3T_{2a}^2}\right) - B_a\Delta_{a0}\left(\text{sech}^2 x + \frac{2\tau}{3T_{2a}}\tanh x\right), \quad (5e)$$

where $$x = \frac{t}{\tau} - \frac{z}{v\tau}, \quad (6)$$

while $$B_g = \frac{1}{1+\tau/T_{2g}}, \text{ and } B_a = \frac{2}{(1+\tau/3T_{2a})(1+\tau/T_{2a})} \quad (7)$$

are chosen such that $\Delta_g \to \Delta_{g0}$ and $\Delta_a \to \Delta_{a0}$ as $t \to -\infty$, so that the equilibrium population completely recovers on every pass of the pulse through the laser. Hence, Eq. 5 shows that stable mode-locked operation can be achieved in the proposed structure. The parameters $\tau$ and $v$ that correspond to the pulse duration and the pulse velocity are determined by the equations $$\frac{\tau/T_{2g}}{1+\tau/T_{2g}}g\Delta_{g0} + \frac{\tau^2/3T_{2a}^2}{(1+\tau/T_{2a})(1+\tau/3T_{2a})}a\Delta_{a0} - l = 0 \quad (8)$$

and $$\frac{1}{v} = \frac{n}{c} - a\tau\frac{\tau/2T_{2g}}{(1+\tau/T_{2a})(1+\tau/3T_{2a})}\Delta_{a0}. \quad (9)$$

The full-width half-maximum pulse duration $\tau_{FWHM}$ equals $1.763\tau$. This solution was previously presented in the special case $\Delta_{g0}=1.0$ and $\Delta_{a0}=-1.0$. We now consider in more detail the special case $T_{2g}=T_{2a}\equiv T_2$. Writing $\bar{g}=g/l$, $\bar{a}=a/l$, and $\bar{\tau}=\tau/T_2$, we find that the condition to suppress the growth of continuous waves becomes $\bar{g}\Delta_{g0}+\bar{a}\Delta_{a0}-1<0$, and the equation for the pulse duration becomes 10, and 11

$$\frac{3}{\bar{\tau}} = \frac{3\bar{g}\Delta_{g0}-4}{2} + \left[\left(\frac{3\bar{g}\Delta_{g0}-4}{2}\right)^2 + 3(\bar{g}\Delta_{g0}+\bar{a}\Delta_{a0}-1)\right]^{1/2}. \quad (10)$$

Equation (10) only has a solution when $\bar{a}<(3\bar{g}\Delta_{g0}-2)^2/12|\Delta_{a0}|$, where we note that $\Delta_{a0}<0$. The conditions for stability may be summarized as $$\frac{(\bar{g}\Delta_{g0}-1)}{|\Delta_{a0}|} < \bar{a} < \frac{(3\bar{g}\Delta_{g0}-2)^2}{12|\Delta_{a0}|}. \quad (11)$$

When $\bar{a}$ is above the upper limit in Eq. (11), we have found by solving Eq. (1) computationally that an initial pulse damps away. When $\bar{a}$ is below the lower limit, continuous waves grow. We have computationally found that multiple pulses are generated in this case.

Figure 4:
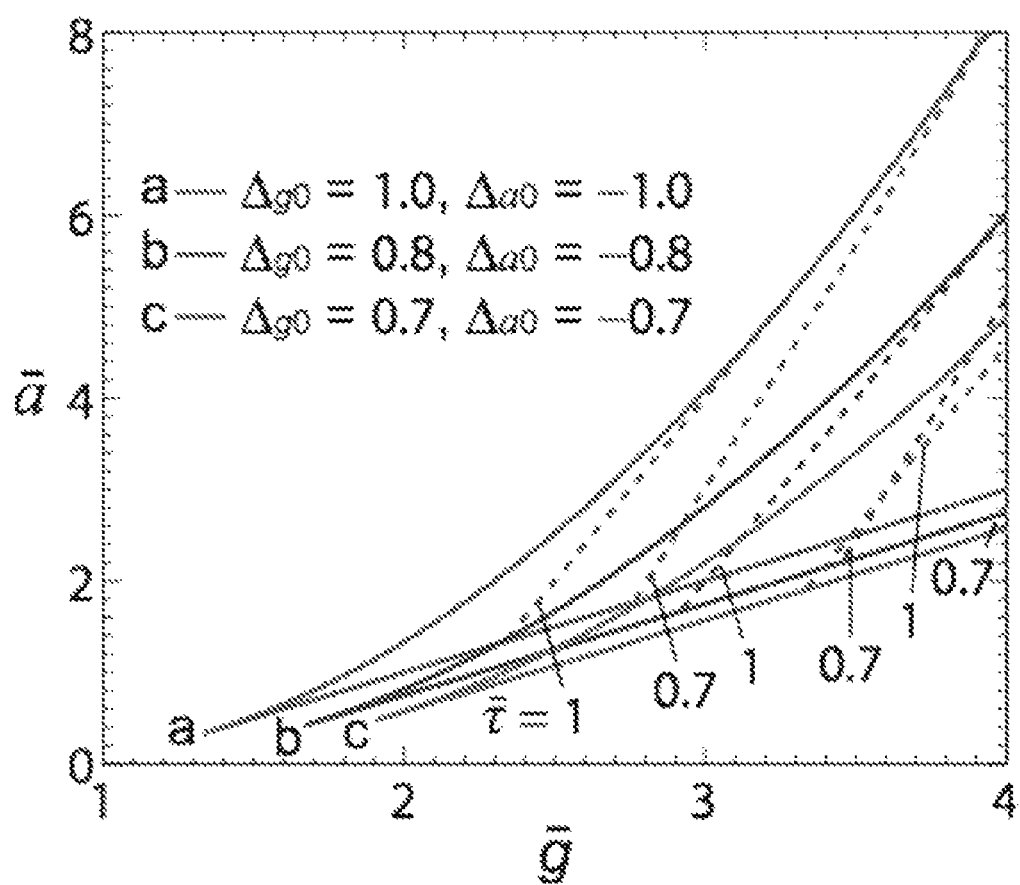
FIG. 4. Stability limits of the normalized absorption ($\bar{a}$) vs the normalized gain ($\bar{g}$) coefficients with different $\Delta_{g0}$ and $\Delta_{a0}$. The ratio $T_1/T_2$ is infinity in all cases. For a given $\bar{\tau}$ and $\bar{a}$, the required $\bar{g}$ increases as $\Delta_{g0}$ and $|\Delta_{a0}|$ decrease.

Equation (11) defines a parameter regime in which stable mode-locked operation is possible. In FIG. 4, we present the stability limits when the population inversion in the gain and absorbing periods vary. In all cases, the lower lines indicate the limiting values for $\bar{a}$, below which continuous waves grow, and the upper lines indicate the limiting values for $\bar{a}$, above which initial pulses damp. FIG. 4 shows that the minimum value of $\bar{g}$ that is required for stable operation increases when $\Delta_{g0}$ decreases and $\Delta_{a0}$ increases by the same amount. There is also a slight decrease in the lower limit for $\bar{a}$ and a larger decrease in the upper limit. Since the upper limit drops more than the lower limit, the stable parameter region becomes smaller. We also show contours of the pulse duration, normalized by the coherence time $T_{2g}$, denoted $\bar{\tau}$, as given by Eq. (10). Pulse durations are approximately on the order of $T_{2g}$ when $\bar{g}\approx 2.5$ and $\bar{a}\approx 2.0$. We also note that pulses become shorter as $\bar{g}$ and $\bar{a}$ increase. However, both $\bar{g}$ and $\bar{a}$ are directly proportional to the current; so, to increase the gain and absorption in a fixed ratio, one must increase the current. At the same time, we note that $\bar{g}$ and $\bar{a}$ are directly proportional to $T_2$. Hence, it is possible to reduce the required current by increasing $T_2$.

Figure 5:
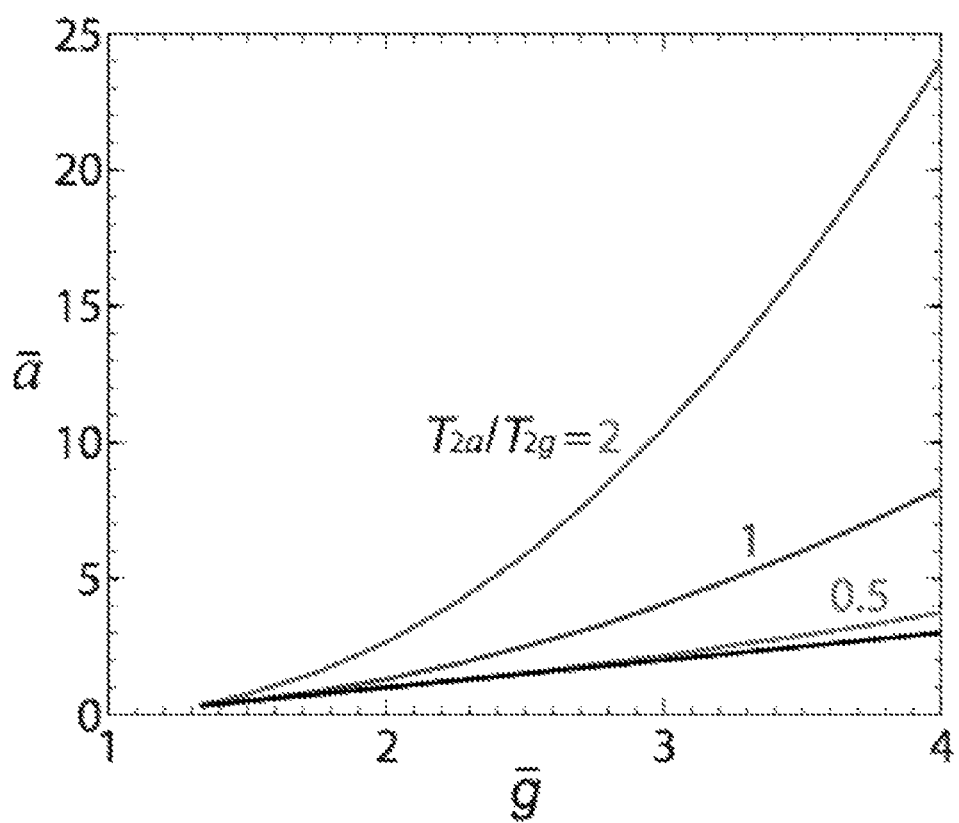
FIG. 5. Stability limits of the normalized absorption ($\bar{a}$) vs the normalized gain ($\bar{g}$) coefficients with different $T_{2a}/T_{2g}$. We set $T_{1g}=T_{1a}=\infty$ in all cases. In equilibrium, the gain medium is completely inverted, i.e., $\Delta_{g0}=1.0$, and the absorbing medium is completely uninverted, i.e., $\Delta_{a0}=-1.0$.

We have studied what happens to the stability limits if $T_{2a}/T_{2g}$ vary and we show the results in FIG. 5. In FIG. 5, we have varied $T_{2a}$ keeping $T_{2g}$ constant. In a QCL, typical values of $T_{2g}$ and $T_{2a}$ are on the order of 100 fs. A change in $T_{2a}$ affects the stability limits more than does a change in $T_{2g}$ as is evident from Eq. 8. When $T_{2a}/T_{2g}$ increases, the upper stability limits increase. When $\bar{g}=4.0$, we find that the upper limit for $\bar{a}$ varies from 3.75 to 8.3 to 24 as $T_{2a}/T_{2g}$ varies from 0.5 to 1.0 to 2.0. The lower limit for $\bar{a}$ remains unchanged.

We now derive an energy-balance equation that describes the energy input limits for stable operation when $\tau \ll T_2$. We define $\Theta(z,t)=\int_{-\infty}^{t}E(z,t')dt'$. Then, Eqs. (1b) and (1c) can be written as $$\frac{\partial \eta_g(z,t)}{\partial t} = \frac{i\mu_g}{2\hbar}\Delta_g(z,t)\frac{\partial \Theta(z,t)}{\partial t} \quad (12)$$

and $$\frac{\partial \Delta_g(z,t)}{\partial t} = 2\frac{i\mu_g}{\hbar}\eta_g(z,t)\frac{\partial \Theta(z,t)}{\partial t}. \quad (13)$$

In the gain medium, the polarization and population inversion can be written in terms of a single angle $\alpha$ as $2i\eta_g=\cos\alpha$ and $\Delta_g=\sin\alpha$. We integrate both sides of Eq. (12) or Eq. (13), after substituting these expressions for $\eta_g$ and $\Delta_g$ and assuming that $\Delta g(z,t\to-\infty)=1$. We then obtain $\alpha(z,t)=\pi/2+(\mu_g/\hbar)\Theta(z,t)$. We may similarly write $2i\eta_a=\cos\beta$ and $\Delta_a=\sin\beta$ in the absorbing medium, and we then find $\beta(z,t)=-\pi/2+(\mu_a/\hbar)\Theta(z,t)$, where we have set $\Delta_a(z,t\to-\infty)=-1$. We now consider Eq. (1a) in steady state, where there is no evolution in z, and in the limit $t\to\infty$, where there is no evolution in t. We also define a normalized pulse energy $$\bar{\theta}(z)=(\mu_g/\hbar)\Theta(z,t\to\infty). \quad (14)$$

Equation (1a) now becomes $$g\sin[\bar{\theta}(z)] = a\frac{\mu_g}{\mu_a}\frac{T_{2g}}{T_{2a}}\sin\left[\frac{\mu_a}{\mu_g}\bar{\theta}(z)\right], \quad (15)$$

where we note that the linear loss may be neglected in the limit $\tau \ll T_2$. In the special case $\mu_a=2\mu_g$, and $T_{2g}=T_{2a}\equiv T_2$, we find $a(\mu_g/\mu_a)(T_{2g}/T_{2a})\sin[(\mu_a/\mu_g)\bar{\theta}]=a\cos\bar{\theta}\sin\bar{\theta}$, so that Eq. (15) becomes $\cos\bar{\theta}=g/a$, which defines the limits of the input energy that is required to generate a single pulse, $$\cos^{-1}(g/a)<\bar{\theta}<2\pi-\cos^{-1}(g/a). \quad (16)$$

When the initial value of $\bar{\theta}$ is within these limits, a single pulse with a final value of $\bar{\theta}=\pi$ is generated. When the initial value of $\bar{\theta}$ is below this value, the lower limit in Eq. (16), the initial pulse damps. When the initial value of $\bar{\theta}$ is above the upper limit, the initial pulse splits into multiple pulses.

In the analysis up to now it has been assumed that the central carrier frequency of the light pulse and the transition frequency in both the gain and absorbing media are the same. Since the frequency of the light is largely determined by the gain medium, it is reasonable to assume that there is no detuning between the light and the gain medium. Even if the mode locking is seeded by injection locking, analogous to the experiment of Choi et al. the injection-locking laser can be tuned to the gain resonance. There may be a small detuning between the gain and absorbing media due to design or growth issues; however, it is possible to design the gain and absorbing media so that detuning is nearly absent. QCLs are currently being grown with high accuracy and experimentally observed wavelengths agree closely with the designed values. If there is a detuning of $\Delta\omega$ between the gain and the absorbing periods and the light pulses are tuned to the gain periods, Eq. 1d becomes $$\frac{\partial \eta_a}{\partial t} = \frac{i\mu_a}{2\hbar}E\Delta_a - \left(\frac{1}{T_2} - i\Delta_\omega\right)\eta_a. \quad (17)$$

Then the solutions for $\eta_a$ and $\Delta_a$ change. Analytical solutions for $\eta_a$ and $\Delta_a$ may be found in the presence of detuning $\Delta_\omega$ when $\tau \ll T_2$, so that the term proportional to $1/T_2$ may be neglected in the polarization equation. Then, the solutions for $\eta_a$ and $\Delta_a$ become $$\eta_a = \frac{\Delta_\omega \tau}{1+(\Delta_\omega\tau)^2}\mathrm{sech}x + i\frac{1}{1+(\Delta_\omega\tau)^2}\mathrm{sech}x\tanh x, \quad (18a)$$

$$\Delta_a = -1 + \frac{2}{1+(\Delta_\omega\tau)^2}\mathrm{sech}x, \quad (18b)$$

where $x=t/\tau-z/v\tau$ and $\Delta_{a0}=-1$ at $t\to\infty$.

On physical grounds, it is apparent that the criterion for acceptable detuning is that $\Delta_\omega \leq 1/T_2$, since $\tau \leq T_2$ and the bandwidth of the pulse in angular frequency is $\sim\tau^{-1}$. If $T_2$ is 100 fs, and we demand conservatively that $\Delta_\omega < 1/T_2$, then $\Delta_\omega < 10^{12}$ s$^{-1}$, corresponding to an allowed frequency detuning of $1.6\times10^{11}$ Hz, which is 2% of the carrier frequency of 8 µm light and is not overly demanding.

In order for the solution reported in Eq. (5) to be of any practical interest, it must be robust when $\mu_a$ differs from $2\mu_g$, when $T_{1g}$ and $T_{1a}$ are on the order of a picosecond or less, when an initial pulse that is long compared to its final, stable duration is injected into the medium, and when the initial pulse area differs from the ideal value of $\pi$ in the gain medium and $2\pi$ in the absorbing medium. The Maxwell-Bloch equations must be solved computationally to determine what happens under these conditions. For computational analysis, we normalize Eq. (1). We define $\bar{E}=(\mu_g T_{2g}/\hbar)E$ and we introduce the retarded time $t'=t-(n/c)z$, the normalized time $\bar{t}=t/T_{2g}$, and the normalized distance $\bar{z}=lz$, so that Eq. (1) becomes $$\frac{\partial \bar{E}}{\partial \bar{z}} = -i\bar{g}\eta_g - i\frac{\bar{a}}{(T_{2a}/T_{2g})\bar{\mu}}\eta_a - \frac{1}{2}\bar{E}, \quad (19a)$$

$$\frac{\partial \eta_g}{\partial \bar{t}} = \frac{i}{2}\Delta_g\bar{E} - \eta_g, \quad (19b)$$

$$\frac{\partial \Delta_g}{\partial \bar{t}} = i(\eta_g\bar{E}^* - \eta_g^*\bar{E}) + \frac{\Delta_{g0}-\Delta_g}{T_{1g}/T_{2g}}, \quad (19c)$$

$$\frac{\partial \eta_a}{\partial \bar{t}} = \frac{i}{2}\bar{\mu}\Delta_a\bar{E} - \frac{\eta_a}{T_{2a}/T_{2g}}, \quad (19d)$$

$$\frac{\partial \Delta_a}{\partial \bar{t}} = i\bar{\mu}(\eta_a\bar{E}^* - \eta_a^*\bar{E}) + \frac{\Delta_{a0}-\Delta_a}{T_{1a}/T_{2g}}, \quad (19e)$$

where $\bar{g}=g/l$, $\bar{a}=a/l$, and $\bar{\mu}=\mu_a/\mu_g$.

Figure 6:
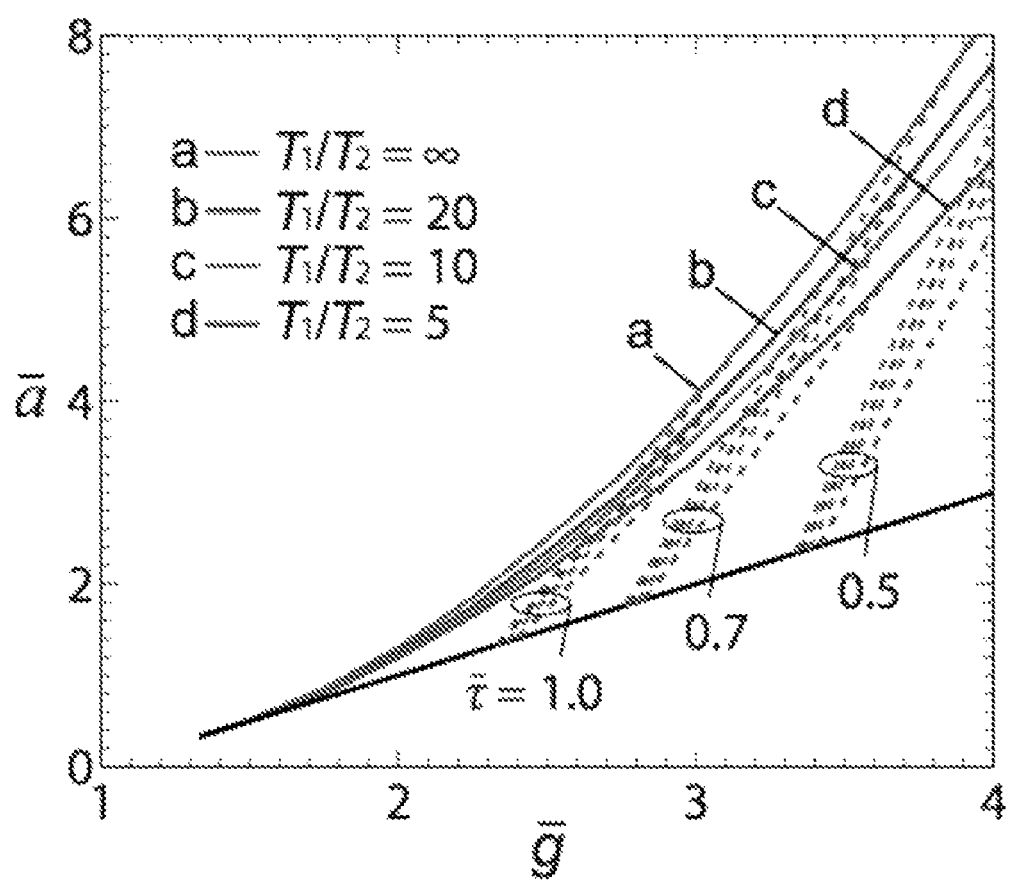
FIG. 6
Figure 7:
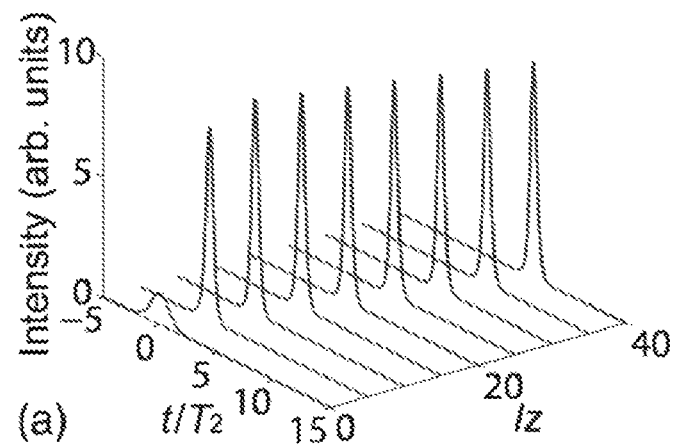
Figure 7:
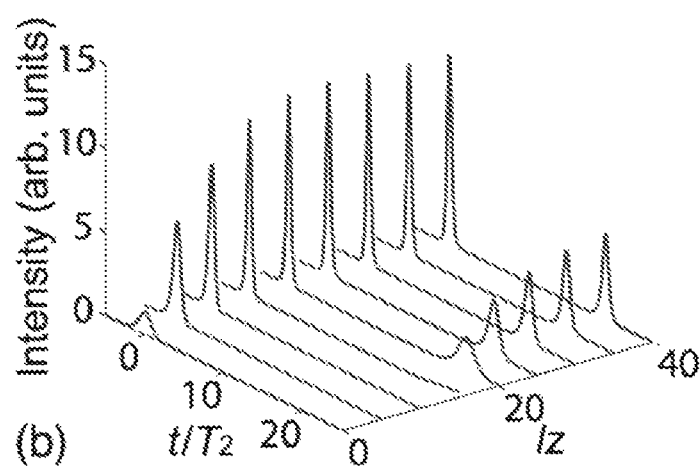
Figure 7:
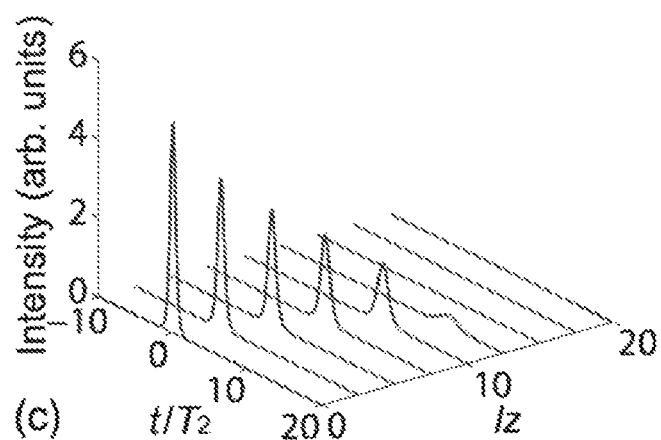

In our simulations, we used different window sizes, depending on the pulse evolution, and we verified that the pulse intensities are always zero at the window boundaries. We spaced our node points 1-5 fs apart, and we chose a step size between 1 and 10 µm, depending on the material parameters in the simulation. In each simulation these values were constant and we checked that reducing these values made no visible difference in our plotted results. Finally, we verified by extending the propagation length that we were following the pulses over a sufficiently long length to reliably determine whether the pulses are stable or not. In FIG. 6, we show the limits of $\bar{g}$ and $\bar{a}$ for stable operation with different values of $T_1/T_2$ when $T_{1g}=T_{1a}\equiv T_1$ and $T_{2g}=T_{2a}\equiv T$. We begin by assuming that a hyperbolic-secant-shaped pulse having an area of $\pi$ is injected into the QCL. Before the pulse is injected, the population is completely in the upper lasing state in the gain medium, i.e., $\Delta_{g0}=1.0$ and is completely in the ground state in the absorbing medium, i.e., $\Delta_{a0}=-1.0$. In FIG. 6, the black solid line at the bottom defines the lower limits of $\bar{a}$ for any $T_1/T_2$. The solid curves on the top are the loss-limited boundaries for different values of $T_1/T_2$. The injected pulses are only stable when the gain and absorption parameters are set between these two boundary limits. Stable pulses propagate in the laser cavity with no change in shape and energy. We show the pulse evolution in the stable regime and unstable regimes in FIG. 7. FIG. 7a shows stable pulse evolution when $\bar{g}=4.0$ and $\bar{a}=3.5$. The laser becomes unstable when operated with $\bar{a}$ smaller than the lower limits given in FIG. 6 due to the growth of continuous waves. In this case, the net gain of the laser becomes positive, i.e., $\bar{g}-\bar{a}-1>0$, and multiple pulses may form in the cavity, leading to the generation of multiple pulses in our simulations. We give an example of this behavior in FIG. 7b. In this case, we set $\bar{g}=4.0$ and $\bar{a}=1.0$; the laser becomes unstable when $\bar{z}=20$ and the laser cavity develops more than one pulse. With $\bar{a}$ greater than the upper limit, the gain medium cannot compensate for absorption and the linear loss. As a result, pulses damp. In FIG. 7c, which exhibits this behavior, we have set $\bar{g}=4.0$ and $\bar{a}=7.8$. The upper limit for $\bar{a}$ decreases when $T_1/T_2$ decreases as shown in FIG. 6, because the damping increases. We also show contours of the stable normalized pulse duration, $\bar{\tau}=\tau_{FWHM}/1.763T_2$, with dashed lines in FIG. 6. Pulse durations are on the order of $T_2$ when $\bar{g} \geq 2.5$ and $\bar{a} \geq 2.0$. The pulse durations can be made arbitrarily short by increasing $\bar{g}$ and $\bar{a}$. However, $\bar{g}$ and $\bar{a}$ are proportional to the current, so that the current must be increased. If $T_1/T_2$ decreases, then $\bar{g}$ must increase if $\bar{a}$ is constant in order to maintain ti at a constant value.

Figure 8:
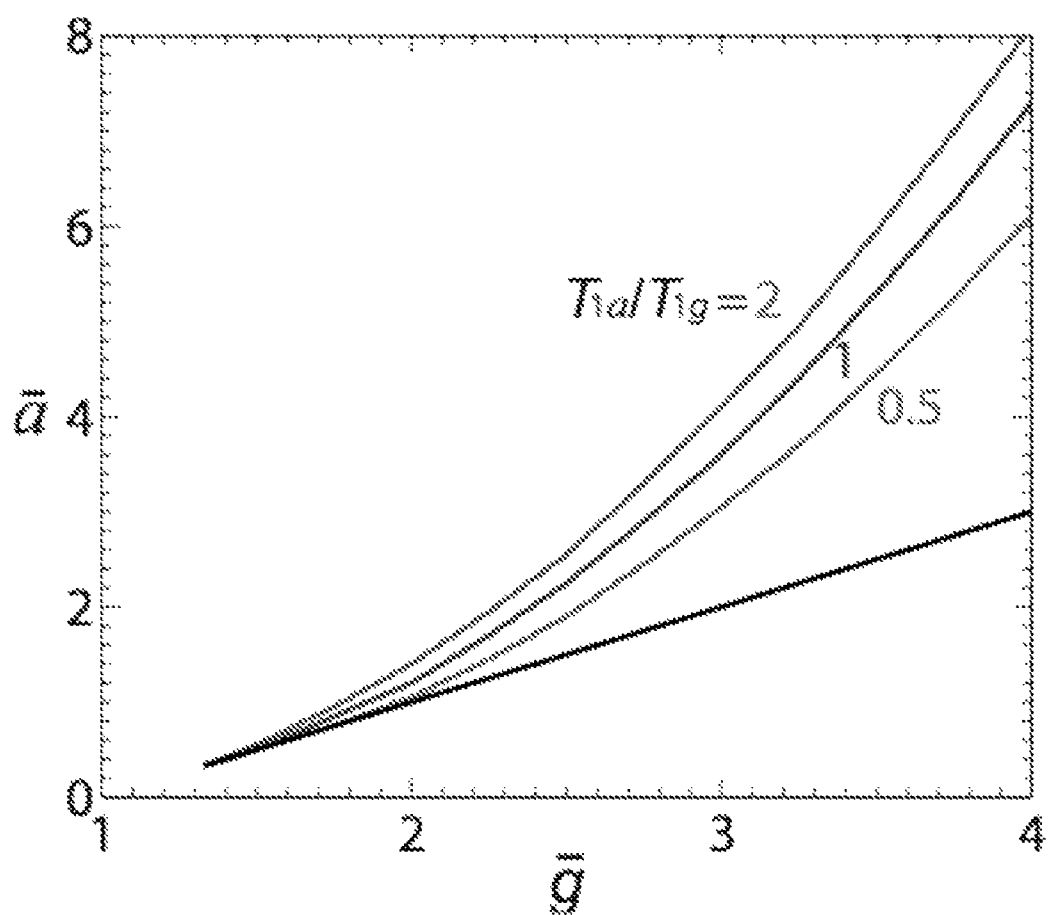
Figure 9:
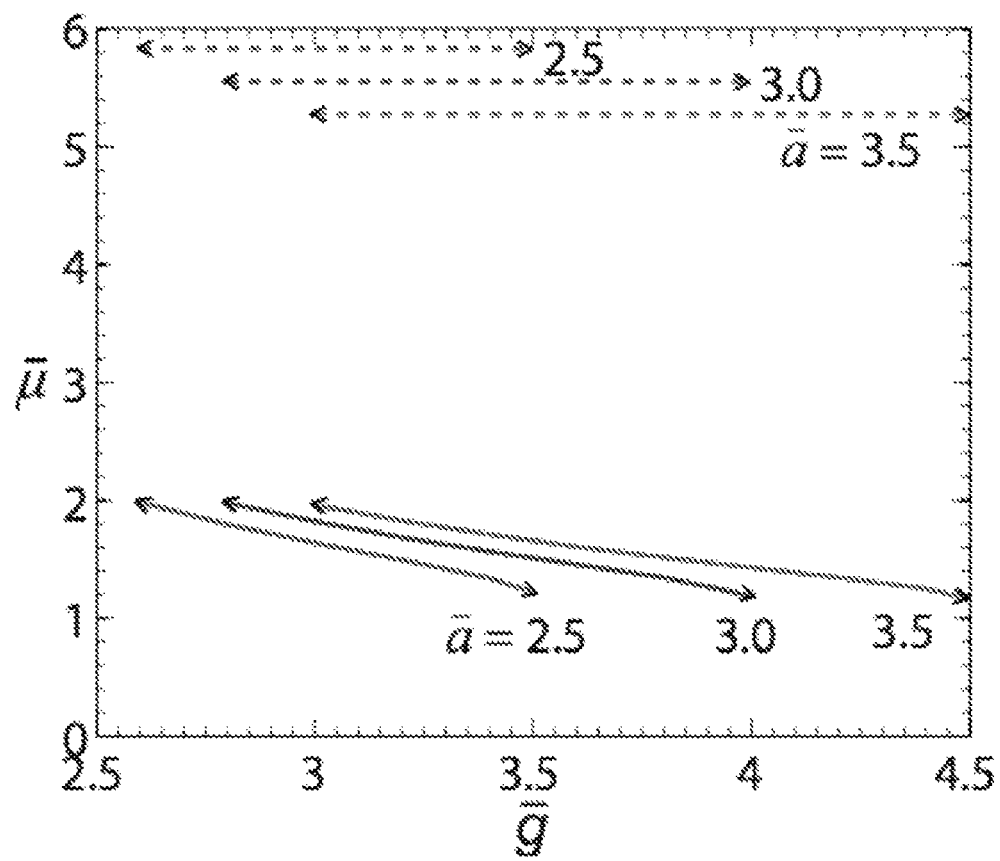
Figure 10:
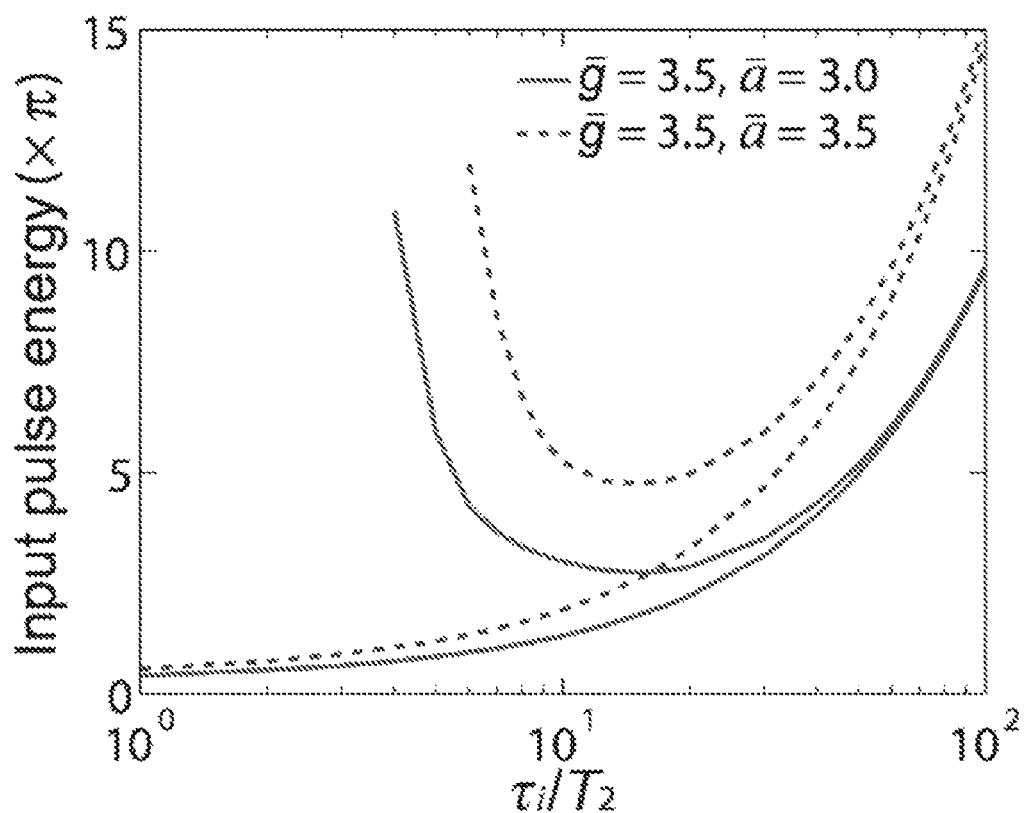

As we discussed, in Sec. III, in a practical QCL design, we must have $T_{1g}>T_{1a}$. For generality, we consider here the stability limits as $T_{1a}/T_{1g}$ varies between 0.5 and 2.0. FIG. 8 shows the stability limits of $\bar{g}$ and $\bar{a}$ as $T_{1a}/T_{1g}$ is varied. The solid black line at the bottom is the lower limit of $\bar{a}$ and remains the same for any $T_{1a}/T_{1g}$. However, the upper limit of $\bar{a}$ decreases when $T_{1a}/T_{1g}$ decreases. The analytical solution of the Maxwell-Bloch equations given in Eq. (5) assumes that the absorbing medium has a dipole moment twice that of the gain medium, i.e., $\mu_a=2\mu_g$. The condition $\mu_a=2\mu_g$ will not be exactly satisfied due to design constraints and growth limitations. The QCL gain is determined by $\mu_g$ and $T_{1g}$. To produce large gain, it is preferable that $\mu_g$ is large. In a vertical transition QCL, the dipole moment is generally 2 nm. In diagonal-transition QCLs, the dipole moment is $\geq 1.4$ nm, which is smaller. Despite the smaller value of $\mu_g$ with diagonal transitions, we must have $\mu_a/e \geq 2.8$ to satisfy the condition $\mu_a=2\mu_g$. Therefore, it is useful in practice if SIT mode locking is possible when $\mu_a<2\mu_g$. We determine the stability limits of $\bar{\mu}=\mu_a/\mu_g$ for stable operation. FIG. 9 shows the lower and upper stability limits of $\bar{\mu}$ vs $\bar{g}$ as $\bar{a}$ varies. The solid lines in FIG. 9 indicate the lower limits for $\bar{\mu}$ while the dashed lines indicate the upper limits. The two ends of each of the lines are at the stability boundaries for $\bar{g}$ at each particular $\bar{a}$. In each of the cases, the minimum value of $\bar{\mu}$ is approximately 2 when $\bar{g}$ is near its minimum, below which an input pulse attenuates. As $\bar{g}$ increases toward the limit at which continuous waves become unstable, the minimum value of $\bar{\mu}$ required for stable operation decreases significantly. Pulses are stable with $\bar{\mu}\sim1.2$ when $\bar{g}=3.5$, 4.0, and 4.5 with $\bar{a}=2.5$, 3.0, and 3.5, respectively, with $\bar{g}$ just below the stability limit for generating continuous waves. However, the stable pulse duration increases significantly as $\bar{\mu}$ decreases. When $\bar{\mu}$ is below the solid lines in FIG. 9, pulses attenuate. The minimum value of $\bar{\mu}$ required for stable operation increases as $\bar{a}$ increases for any fixed $\bar{g}$. We have found no hard upper limit to stability as $\bar{\mu}$ increases, although the pulses are increasingly distorted. The dashed lines in FIG. 9 indicate the values of $\bar{\mu}$ at which the pulses become double peaked. We have derived an energy balance equation in Eq. (16) that defines the limits of the input energy for stable operation. However, Eq. (16) assumes that input pulse has a duration, $\tau_i = \tau_{FWHM}/1.763 \ll T_2 \ll T_1$, so that the effects of a finite coherence time $T_2$ and damping due to finite $T_1$ may be ignored. If this condition is not satisfied, then Eq. (16) is no longer valid. From a practical standpoint, an input pulse having a duration on the order of $T_2$ or longer than $T_2$ is advantageous. We have calculated the dependence of the minimum and maximum input energy on the input pulse duration for two different combinations of gain and loss. We show the results in FIG. 10. The input pulse duration is normalized to $T_{2g} = T_{2a} \equiv T_2$ and is plotted on a logarithmic scale. The value of $T_1/T_2$ has been set to 10. When $\tau_i/T_2 = 0.1$, we find that the minimum normalized energy $\bar{\theta} = (\mu_g/\hbar) \int_{-\infty}^{\infty} E dt = \int_{-\infty}^{\infty} \bar{E} d\bar{t}$ that is required for stable operation is $0.30\pi$ when $\bar{g} = 3.5$ and $\bar{a} = 3.0$. However, as we increase $\tau_i/T_2$, the minimum normalized pulse energy that is required for stable operation increases significantly due to the pulse's decorrelation over its duration. It increases to $0.42\pi$ when $\tau_i/T_2 = 1$, $1.31\pi$ when $\tau_i/T_2 = 10$, and $9.59\pi$ when $\tau_i/T_2 = 100$. Pulses are stable for an input energy of at least $20\pi$ when $\tau_i/T_2 \leq 3$. We find that pulses split into multiple pulses when the input pulse energy is $\geq 2\pi$. However, at the stable pulse duration $\bar{\tau} \sim 0.5$ for the parameters $\bar{g} = 3.5$, $\bar{a} = 3.0$, only one pulse is stable, and the others damp even with an initial normalized energy of $20\pi$ when $\tau_i/T_2 < 4$. When $\tau_i/T_2 < 4$, continuous waves become unstable. We find that multiple pulses are generated when the input energy is $\geq 3\pi$ with $\tau_i/T_2 = 10$. The upper stability limit for the input energy decreases as $\tau_i/T_2$ increases when $\tau_i/T_2 \leq 10$. However, beyond that point, the upper stability limit increases with $\tau_i/T_2$ as damping due to $T_1$ comes into effect. The stability limits for the input normalized energy when $\bar{g} = 3.5$ and $\bar{a} = 3.5$ show a similar trend with the exception that both the stability limits are shifted upward due to an increase in absorption. We simulated a number of cases in which we investigated the effect of detuning the absorbing medium from the gain medium and the carrier frequency of the light. Setting $T_1/T_2 = 10$, $\Delta_{g0} = 1.0$, and $\Delta_{a0} = -1.0$, we found that stable operation can be obtained with a detuning $\Delta_\omega T_2 \leq 0.53$ when $\bar{g} = 3.5$, $\bar{a} = 3.5$. Stable operation can be obtained with $\Delta_\omega T_2 \leq 0.36$ when $\bar{g} = 3.5$, $\bar{a} = 3.0$, and with $\Delta_\omega T_2 \leq 0.15$ when $\bar{g} = 3.5$, $\bar{a} = 2.5$.

Accordingly, in the context of the above teaching, it has been shown that by combining absorbing with gain periods in a QCL, one can create nearly ideal conditions to observe SIT mode locking and thereby obtain pulses that are less than 100 fs long from a mid-infrared laser. Here we also show that this analysis can be extended using detailed computational studies of the Maxwell-Bloch equations, to illustrate the stability of the solutions as the equation parameters vary. The solutions demonstrate the robustness of the SIT mode-locking technique and that QCLs can be mode-locked using the SIT effect within practically achievable parameter regimes.

Any references recited or referred to herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A self-induced transparency mode-locked quantum cascade laser, comprising:
   (i) an active section comprising a plurality of quantum well layers deposited in alternating layers on a plurality of quantum barrier layers and form a sequence of alternating gain and absorbing periods, said alternating gain and absorbing periods interleaved along the growth axis of the active section, wherein the absorbing periods have a dipole moment of about twice that of the gain periods;
   (ii) an optical cavity that houses the active section and permits amplified light to escape;
   (iii) an externally supplied seed pulse; and
   (iv) current injectors structured and arranged to apply an electric control field to the active section.

2. The laser of claim 1, further comprising wherein the quantum barrier layers are made using Indium-Aluminum-Arsenide, and the quantum well layers are made using Indium-Gallium-Arsenide.

3. The laser of claim 1, further comprising wherein the gain and absorbing periods are designed to provide a mid-IR wavelength laser.

4. The laser of claim 1, further comprising wherein the gain and absorbing periods are designed to provide a mid-IR wavelength laser having a wavelength of between about 8 micrometers and about 12 micrometers.

5. The laser of claim 1, further comprising wherein the gain and absorbing periods are designed to provide coherence times $\ll$ gain recovery times $\ll$ round trip times.

6. The laser of claim 1, further comprising wherein the gain and absorbing periods are designed to provide coherence times of at least 100 femtoseconds, gain recovery times of at least 1 picosecond, and round trip times of at least 50 picoseconds.

7. The laser of claim 1, further comprising wherein the gain and absorbing periods are designed to provide a heterostructure having a ratio of 4 gain periods:1 absorbing period.

8. The laser of claim 1, further comprising wherein the input pulse is a $\pi$ pulse in the gain medium.

9. The laser of claim 1, further comprising wherein each gain period and each absorbing period have over 16 quantum layers.

10. The laser of claim 1, further comprising wherein the gain and absorbing periods are designed to suppress continuous waves and eliminate spatial hole burning.

11. The laser of claim 1, further comprising wherein the gain and absorbing periods are designed to provide a mid-IR wavelength laser having pulse length less than 100 femtoseconds long.

* * * * *